United States Patent
Nickel

(10) Patent No.: US 10,162,030 B2
(45) Date of Patent: Dec. 25, 2018

(54) METHOD AND APPARATUS FOR RECONSTRUCTION OF MAGNETIC RESONANCE IMAGE DATA FOR MULTIPLE CHEMICAL SUBSTANCES IN MULTI-ECHO IMAGING

(71) Applicant: Siemens Aktiengesellschaft, Munich (DE)

(72) Inventor: Marcel Dominik Nickel, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 33 days.

(21) Appl. No.: 15/016,883

(22) Filed: Feb. 5, 2016

(65) Prior Publication Data

US 2016/0232663 A1  Aug. 11, 2016

(30) Foreign Application Priority Data

Feb. 5, 2015 (DE) .......................... 10 2015 202 062

(51) Int. Cl.
```
G06K 9/00      (2006.01)
G01R 33/48     (2006.01)
G06T 11/00     (2006.01)
```
(52) U.S. Cl.
CPC ........ *G01R 33/4828* (2013.01); *G06T 11/003* (2013.01)

(58) Field of Classification Search
CPC ........... G01R 33/4828–33/485; G06T 11/003–11/008
USPC .......... 382/131, 128; 324/307, 309; 600/410
See application file for complete search history.

(56) References Cited

U.S. PATENT DOCUMENTS

| | | | |
|---|---|---|---|
| 8,064,674 B2 | 11/2011 | Fenchel et al. | |
| 8,638,098 B2 * | 1/2014 | Feiweier .......... | G01R 33/56509 324/307 |
| 8,886,283 B1 * | 11/2014 | Chen .................... | A61B 5/055 382/128 |
| 9,341,694 B2 * | 5/2016 | Pfeuffer ............... | A61B 5/055 |
| 9,506,998 B2 * | 11/2016 | Grodzki ............ | G01R 33/4816 |
| 9,645,215 B2 * | 5/2017 | Nickel ............... | G01R 33/4828 |
| 9,823,322 B2 * | 11/2017 | Kannengiesser .... | G01R 33/485 |
| 2007/0285094 A1 * | 12/2007 | Reeder ............... | G01R 33/4828 324/313 |

(Continued)

OTHER PUBLICATIONS

Doneva et al., "Compressed Sensing for Chemical Shift-Based Water-Fat Separation," Magnetic Resonance in Medicine, vol. 64, pp. 1749-1759 (2010).

(Continued)

*Primary Examiner* — Aaron W Carter
(74) *Attorney, Agent, or Firm* — Schiff Hardin LLP

(57) ABSTRACT

In a method and apparatus for the reconstruction of image data for at least two different chemical substance types, the reconstruction relates to a defined region of an examination object and is based on raw data acquired from the defined region at different echo times by a magnetic resonance scan. The reconstruction is implemented using a target function that includes a regularization term that correlates image data of the different echo times. A method for ascertaining image data for at least two different chemical substance types in a defined region of an examination object by an imaging magnetic resonance scan can also be implemented.

14 Claims, 2 Drawing Sheets

(56) References Cited

U.S. PATENT DOCUMENTS

| | | | | |
|---|---|---|---|---|
| 2008/0012566 | A1* | 1/2008 | Pineda | G01R 33/5611 324/309 |
| 2011/0268332 | A1* | 11/2011 | Hofstetter | G01R 33/4804 382/131 |
| 2012/0169337 | A1* | 7/2012 | Weng | A61B 5/055 324/309 |
| 2012/0271146 | A1* | 10/2012 | Kober | A61B 5/055 600/410 |
| 2013/0221961 | A1* | 8/2013 | Liu | G01R 33/56545 324/307 |
| 2015/0042334 | A1* | 2/2015 | Kannengiesser | G01R 33/3664 324/309 |
| 2015/0051474 | A1* | 2/2015 | Eggers | G01R 33/5605 600/410 |
| 2015/0061667 | A1 | 3/2015 | Nickel | |
| 2016/0124064 | A1* | 5/2016 | de Weerdt | G01R 33/243 324/309 |
| 2016/0216352 | A1* | 7/2016 | Eggers | G01R 33/4828 |
| 2016/0231405 | A1* | 8/2016 | Eggers | G01R 33/4828 |
| 2016/0252595 | A1* | 9/2016 | Nehrke | A61B 5/055 324/309 |
| 2016/0313421 | A1* | 10/2016 | Fuderer | G01R 33/4816 |
| 2016/0313422 | A1* | 10/2016 | Boernert | G01R 33/4828 |
| 2016/0313423 | A1* | 10/2016 | Eggers | G01R 33/4828 |
| 2017/0350951 | A1* | 12/2017 | Samsonov | G01R 33/485 |

OTHER PUBLICATIONS

Otazo et al., "Motion-guided low-rank plus sparse (L+S) reconstruction for free-breathing dynamic MRI," Proc. Intl. Soc. Mag. Reson. Med., No. 22, p. 0742 (2014).

Bahri et al., "Three-Nearest-Neighbor Alignment for Smooth ESPIRiT Maps," Proc. Intl. Soc. Mag. Reson. Med., No. 22, p. 4394 (2014).

Zhang et al., "Fast 3D Free-breathing Abdominal Dynamic Contrast Enhanced MRI with High Spatiotemporal Resolution," Proc. Intl. Soc. Mag. Reson. Med., No. 22, p. 0332 (2014).

Zhang et al., "Coil Compression for Accelerated Imaging with Cartesian Sampling," Magnetic Resonance in Medicine, vol. 69, pp. 571-582 (2013).

Candès et al., "Robust Principal Component Analysis?," arXiv:0912.3599v1, [cs.IT] (2009).

Moore et al., "Dynamic MRI Reconstruction using Low-Rank plus Sparse model with Optimal Rank Regularized Eigen-Shrinkage," Proc. Intl. Soc. Mag. Reson. Med., No. 22, p. 0740 (2014).

Zhang et al., "Fast 3D DCE-MRI with Sparsity and Low-Rank enhanced Spirit (SLR-SPIRiT)," Proc. Intl. Soc. Mag. Reson. Reson. Med., vol. 21, p. 2624 (2013).

Lu et al., "Water-Fat Separation with Bipolar Multiecho Sequences," Magn. Reson. Med., vol. 60, pp. 198-209 (2008).

He et al., "Regularized Iterative Reconstruction for Undersampled BLADE and Its Applications in Three-point Dixon Water-fat Separation," Magn. Reson. Med., vol. 65, pp. 1314-1325 (2011).

Berglund et al., "Three-Dimensional Water/Fat Separation and T2* Estimation Based on Whole-Image Optimization-Application in Breathhold Liver Imaging at 1.5 T," Magnetic Resonance in Medicine, vol. 67, pp. 1684-1693 (2012).

Wiens et al., "R*2-Corrected Water-Fat imaging Using Compressed Sensing and Parallel Imaging," Magnetic Resonance in Medicine, pp. 1-9 (2013).

* cited by examiner

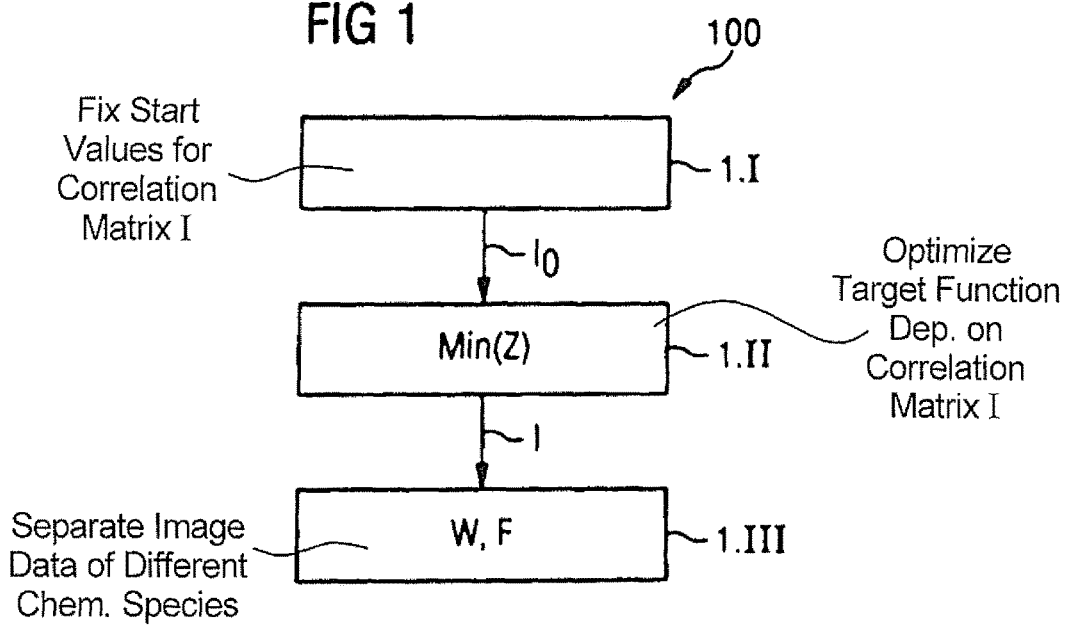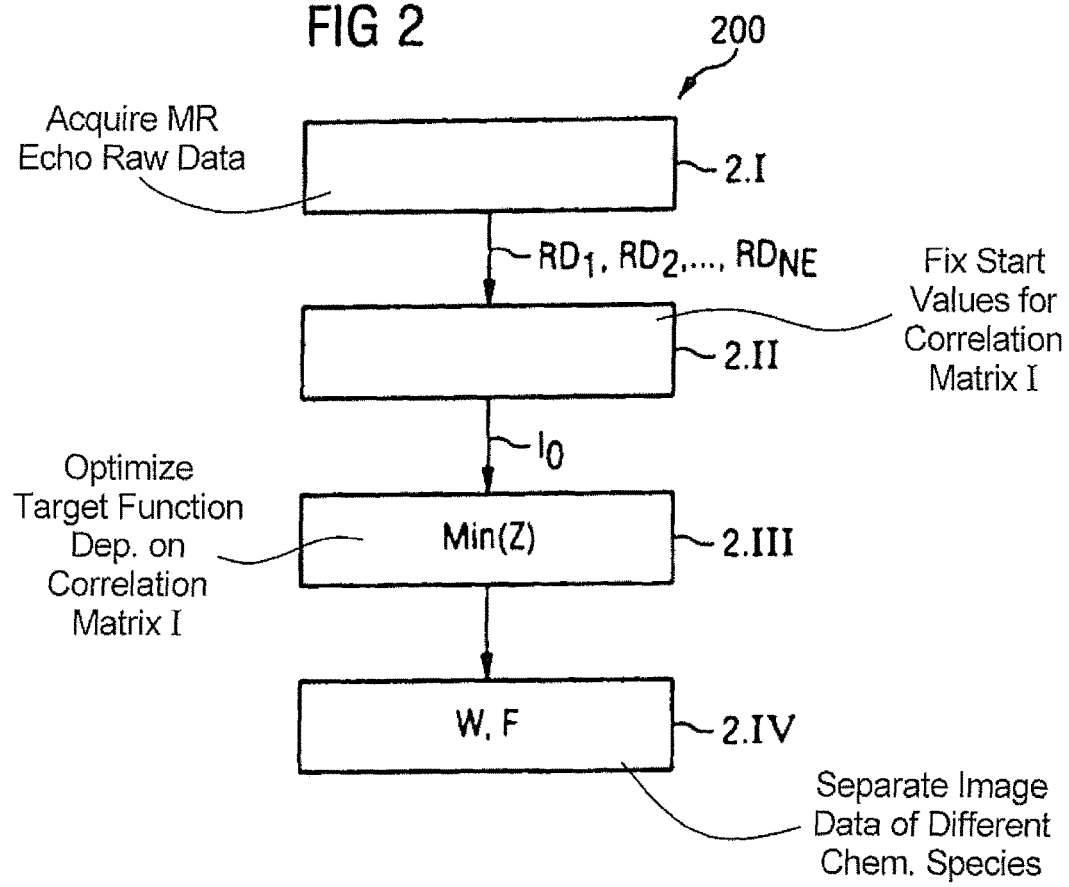

METHOD AND APPARATUS FOR RECONSTRUCTION OF MAGNETIC RESONANCE IMAGE DATA FOR MULTIPLE CHEMICAL SUBSTANCES IN MULTI-ECHO IMAGING

BACKGROUND OF THE INVENTION

Field of the Invention

The invention concerns a method for the reconstruction of image data for at least two different chemical substance types in a defined region of an examination object from raw data that has been ascertained for the defined region at different echo times in a magnetic resonance scan. Furthermore, the invention concerns a method for ascertaining image data for at least two different chemical substance types in a defined region of an examination object by execution of an imaging magnetic resonance scan. The invention also concerns an image processing computer for the reconstruction of image data for at least two different chemical substance types in a defined region of an examination object from raw data has been ascertained for the defined region at different echo times in a magnetic resonance scan. Furthermore, the invention concerns a magnetic resonance system having such an image processing computer.

Description of the Prior Art

In a magnetic resonance scan wherein raw data generated are acquired, by operation of scanner, a magnetic resonance from a region of the inside of the body of an examination object, the body or the body part to be examined must first be exposed to an optimally homogeneous static basic magnetic field in the scanner, usually called the $B_0$ field. The nuclear spins in the body are thereby oriented parallel to the direction of the $B_0$ field (conventionally called the z direction). In addition, radio-frequency pulses (RF pulses) are radiated into the examination object using suitable radio-frequency antennae whose frequency is in the region of the resonance frequency, what is known as the Larmor frequency, of the nuclei to be excited in the present magnetic field. These radio-frequency pulses cause the spins of the relevant nuclei, usually hydrogen nuclei, to be excited in the examination object such that they are deflected by an amount known as an "excitation flip angle" from their position of equilibrium parallel to the basic magnetic field $B_0$. The nuclear spins then precess around the z direction and gradually relax again, with the relaxation being dependent on the molecular surroundings in which the excited nucleus is located. The magnetic resonance signals generated during relaxation are received as raw data by radio-frequency receiving antennae, and are entered at respective entry points into a memory. The data in the memory are called k-space, and magnetic resonance images (image data) are reconstructed on the basis of the acquired raw data in k-space. Spatial encoding of the magnetic resonance signals occurs with the activation of rapidly-switched gradient magnetic fields that are superimposed on the basic magnetic field during emission of the magnetic resonance radio-frequency pulses and/or the acquisition of the raw data.

A generally known basic problem in the acquisition of raw data is that the excited nuclei in the body tissue do not have a uniform resonance frequency in the magnetic field. Instead these can differ for different tissue types or substance types according to their chemical surroundings. This is conventionally called a chemical shift. As used herein, a substance type (or substance for short) means any type of predefined chemical substance or any type of nucleus in an atom or molecule having specific magnetic resonance behavior. A typical example of different substance types are the substance types fat and water. A substance type can contain multiple components that have (slightly) different resonance frequencies. For example, the substance type, as described in more detail below, can be described by a chemical spectral model having a number of peaks with respect to the resonance frequency. Different substance types thus also encompass within their meaning more complex chemical compounds or mixtures that have different components and possibly also different resonance frequencies, but combine to form a characteristic spectrum. Particularly relevant in magnetic resonance imaging is the chemical shift of fat tissue in relation to the conventionally excited water, since fat occurs in significant quantities in many regions of the body. The chemical shift between fat tissue and water is approximately 3.4 ppm.

Various methods are known to create separate magnetic resonance images for different substance types, for example to generate separate water and fat images. A typical method for this purpose is what is known as the two-point Dixon method. For this purpose, raw data acquired, using suitable magnetic resonance sequences, during two different echoes, for example two different gradient echoes or spin echoes, with these echoes differing in their echo time.

For example, for two chemical substance types the complex-value signals $S_1(x)$ and $S_2(x)$ at one image point having the coordinates v can be represented by the equations $$S_1(x)=(W(x)+c_1F(x))e^{i\varphi1(x)} \quad (1)$$

$$S_2(x)=(W(x)+c_2F(x))e^{i\varphi2(x)} \quad (2)$$

Here $W(x)$ again denotes the water and $F(x)$ the fat content at the respective image point. Basically $W(x)$ and $F(x)$ can also denote any other chemical substance types. $S_1(x)$ and $S_2(x)$ are the intensity values for the first echo and for the second echo at the respective image point. In the case of two-dimensional image data, an image point here and below means a pixel, and in the case of three-dimensional image data a voxel. For shorthand, x is used to represent the coordinates of the image point, which are multi-dimensional. Solely for simplicity, the conventional notation for water and fat will be used since this is the most common application. In the equations (1) and (2) $c_1$ and $c_2$ are complex-value coefficients that depend on the echo time and the spectrum of the second chemical substance (i.e. here as an example the spectrum of the fat F). Due to the dephasing each of the recorded images is slightly different, even if the same region is acquired in each case, since each chemical substance oscillates slightly differently. In equations (1) and (2), for simplicity, it is assumed, moreover, that a complicated spectrum exists only for one of the two chemical substance types, here the fat F. This method may also be expanded to other substance types. In this case, a complex-value coefficient must likewise be inserted before the W component in equations (1) and (2). In addition, it is assumed in equations (1) and (2) that the phases or phase rotations of the signals are each given by $\varphi_1(x)$ and $\varphi_2(x)$.

The exponents $\varphi_1$ and $\varphi_2$ in equations (1) and (2) may be generally described as follows:

$$\Phi(t,x)=\Omega(x)\cdot t\pm\Phi_{EC}(x)+\phi(t,x) \quad (3)$$

Here $\Phi$ is the phase accumulation at a specific location at a specific time, $\Omega(x)$ the local off-center frequency, $\Phi_{EC}(x)$ the phase accumulation of opposed polarities due to eddy currents and $\varphi(t,x)$ the phase after excitation. The relaxation over time is modeled by a positive imaginary part of $\Omega(x)$.

Various algorithms are known to generate the water image W and the fat image F from the acquired signals using equations (1) and (2). Due to possible field inhomogeneities, gradient delays, eddy currents, etc. it is very important for the two-point Dixon method to determine the global phase rotation (p between the echo times per image point and to then take it into account in the reconstruction. For this purpose, it is conventionally assumed that the variation in the phase rotation is spatially weak, i.e. that the variation between adjacent image points is for example <180°. The conventional solution methods are based on iteration methods with which solutions to equations 1 and 2 are ascertained.

In many cases, multi-echo sequences are used in the imaging method, in which raw data are acquired at many different echo times $T_{E,e}$, where $e=1, \ldots, N_E$ with $N_E$ equal to the number of echoes. Often the raw data acquired per echo are undersampled, meaning that not every available data entry point in k-space is filled. This means the image data has to be reconstructed from raw data of a number of echoes. The number of echoes increases the amount of information, and therefore provides a possibility for compensating the undersampling. The phases of the signals between the individual echo times are subject to changing spatially according to equation (3), however, which must be taken into account when ascertaining the image data of the individual chemical substances.

In the case of the signal model according to equations (1) and (2) or an equation system expanded to a number of echoes, when the development of the phase accumulation over time and the disruptive effects, as are described by equation (3), are to be taken into account, then a non-linear optimization problem is conventionally solved, which converges only slowly, and it is not guaranteed that there will be a convergence in the sense of a global minimum.

SUMMARY OF THE INVENTION

An object of the present invention is to provide a method and a suitable image processing computer for the reconstruction of image data for at least two different chemical substance types, with the method and apparatus being robust with respect to the described disruptive effects and with respect to a desired convergence, and being distinguished by improved effectiveness.

In the inventive method image data are reconstructed for at least two different chemical substance types in a defined region, for example an ROI or slice of an examination object, from raw data that have been ascertained for the defined region at different echo times by execution of a magnetic resonance scan, with the use of a target function. The target function has a regularization term, representing a correlation of respective sets of image data of the different echo times. Correlation of the image data is in this context means a spatial and time-related correlation of the image data.

The inventive method for the reconstruction of image data is based, inter alia, on decoupling the reconstruction of image data of the mixture of substances, and the separation of the image data of the different substances from each other, so the optimization problems to be solved become linear.

A further basis the inventive method for the reconstruction of image data is that, for image data from a specific local region, the phase accumulation is spatially constant or varies only slightly. This property is taken into account when establishing the target function by adding a regularization term to the target function. This term has a value that indicates a measure of the correlation of the reconstructed image data.

A first term DK of the target function indicates, for example, a measure of the consistency of a signal function $S_e(x)$ with the raw data $D_{c,e}(k)$ acquired in the MR imaging method in k-space by the coil c for the echo e in each case:

$$DK = \sum_{k,e,c} \left| \sum_i u_{k,i} C_c(x_i) S_e(x) - D_{c,e}(k) \right|^2 \quad (4)$$

Here $C_c(x_i)$ is the coil sensitivity of coil c at location $x_i$, and the total of $u_{k,i}$ is the Fourier transform of the sought signal function $S(T_{E,e,x})=S_e(x)$.

A second term of the target function comprises what is known as the regularization term R, so the entire target function Z results as follows:

$$Z=DK+\lambda*R \quad (5)$$

Here λ is a Lagrange multiplier. The Lagrange multiplier λ can be determined using a reference data record. It may also be adaptively estimated for each reconstruction.

The result of the reconstruction with the use of the target function Z is therefore the sought signal function $S(T_{E,e},x)=S_e(x)$, which is not yet separated according to different chemical substances, however.

A method, which is based on the Dixon algorithm, can for example then be used for the separation according to different chemical substances. The advantage with such a procedure is that the more laborious image reconstruction constitutes a convex optimization problem for which efficient optimization algorithms exist, while established algorithms can be used for the non-linear separation. In addition, the regularization during image reconstruction produces an averaging effect which leads to a reduction in artifacts.

In the inventive method for ascertaining image data for at least two different chemical substance types in a defined region, for example an ROI or slice of an examination object, by execution of an imaging magnetic resonance scan, magnetic resonance echo raw data of the defined region are acquired at different echo times and image data of the defined region are reconstructed on the basis of the magnetic resonance echo raw data using the inventive method for the reconstruction of image data.

An image processing computer for the reconstruction of image data for at least two different chemical substance types in a defined region of an examination object from raw data, which has been ascertained for the defined region at different echo times by means of a magnetic resonance scan, requires, inter alia, the following components.

Firstly an interface is required for acquiring magnetic resonance echo raw data of the defined region, which have been ascertained at different echo times.

Furthermore, the image processing computer has an image data reconstruction processor designed to execute an algorithm for the reconstruction of image data of the defined region on the basis of the acquired magnetic resonance echo raw data.

According to the invention, the image reconstruction processor is designed (configured) to execute the algorithm with an optimization procedure that optimizes a target function, which has a regularization term R, representing a correlation of image data of the different echo times.

The image processing computer can also be designed so as to be suitable for generating separate image data of different chemical substances as well, so the image reconstruction processor can also has an image ascertainment processor that is designed to ascertain the separated image data for the chemical substance types on the basis of the optimized, but not yet separated according to substance type, image data, obtained during optimization for the defined region ROI. Separation can be carried out, for example, with the use of a known Dixon method.

The image processing computer also has suitable output interfaces, for example to transfer the ascertained optimized raw data to a different processor that can then generate the image data of the different chemical substance types or, if the image processing computer itself generates the image data of the two mutually different chemical substance types, a corresponding output interface for the generated image data, so that the image data can then be stored and/or presented, to an operator and/or be sent via a network to further locations, optionally for further processing and/or presentation.

Apart from a basic field magnet that produces a basic magnetic field in the patient scan space of the scanner, a transmitting antenna system, with which the radio-frequency signals are emitted, a gradient system having multiple gradient coils, a radio-frequency receiving antenna and a corresponding controller that controls all of the components, the inventive magnetic resonance apparatus must additionally have an image processing computer, as described above. A magnetic resonance apparatus of this kind also has a large number of further components (not described in detail) that are known to those skilled in the art.

The basic components of the image processing computer can be designed for the most part in the form of software components, such as components or modules for performing the image data reconstruction algorithm, the optimization algorithm and the optional image ascertainment algorithm. These components can also partly be implemented in the form of software-supported hardware, for example FPGAs or the like, if particularly fast calculations are involved. If, for example, it is only a matter of an acquisition of data from other software components, the required interfaces can likewise be designed as software interfaces. The interfaces, however, also can be designed as interfaces constructed in terms of hardware that are controlled by appropriate software.

As mentioned, an image processing computer of this kind can be connected independently as an image processor to a suitable network, for example a radiological information system (RIS), to which the magnetic resonance system is also connected, in order to supply the required data from there to the image processing computer. The image processing computer may also be implemented within a controller of the magnetic resonance apparatus, since a large number of the needed components are present there anyway, and can also be used to perform the inventive method when configured as described above.

A largely software-based implementation has the advantage that conventional image processing computers or magnetic resonance apparatus controllers that have conventionally been used can easily be upgraded by a software update in order to function inventively. In this respect, the above object is also achieved by a non-transitory, computer-readable data storage medium, which can therefore be loaded directly into a memory of a programmable image processing computer, that has program code to carry out all steps of the inventive method when the code is executed in the image processing computer.

In a preferred embodiment of the inventive method the regularization term is based on a correlation matrix which takes into account the sought image data values at different echo times and at different image points.

The correlation matrix I designates the strength of the signals $S(T_{E,e},x)=S_e(x)=I_e(x)$ allocated to one specific location x and one specific echo e having a corresponding echo time $T_{E,e}$ for a specific local region having constant phase accumulation $\Phi$ and a number of echoes $N_E$. The local region is defined by the voxels $\{x_i\}_{i=1, \ldots, NP}$, where $N_P$ corresponds to the number of voxels in the local region. The correlation matrix I therefore has the following form:

$$I_{e,i} = \begin{pmatrix} I_1(x_1) & I_1(x_2) & I_1(x_3) & \ldots & I_1(x_{N_P}) \\ I_2(x_1) & I_2(x_2) & \ddots & \ldots & \\ \vdots & & & & \\ I_{N_E}(x_1) & \ddots & \ddots & \ldots & \end{pmatrix}_{e,i} \quad (6)$$

The regularization term R can be based on a nuclear norm of a local correlation matrix which takes into account the sought image data values at different echo times and at different image points of a local region.

The nuclear norm of the above-described local correlation matrix is:

$$\| I^{(P,i)} \|_* = sp\sqrt{I^{(P,i)+}I^{(P,i)}} = \sum_j |\sigma_j| \quad (7)$$

Here $\sigma_j$ are the singular values of the matrix $I^{(P,i)}$ in relation to the $i^{th}$ local region. P indicates the total of the local regions. The matrix $I^{(P,i)+}$ is the matrix adjoint to $I^{(P,i)}$.

In a particularly effective variant of the inventive method the regularization term R is based on a total of the nuclear norms of a number of local correlation matrices $I^{(P,i)}$.

For example, the regularization term R as the total of the nuclear norms of all P local regions is $$R = \sum_{i=1}^{P} \| I^{(P,i)} \|_* \quad (8)$$

The entire target function, on which the inventive method for ascertaining image data is based, for this embodiment is:

$$Z = DK + \lambda * R = \sum_{k,e,c} \left| \sum_i u_{k,i} C_c(x_i) I_e(x) - D_{c,e}(k) \right|^2 + \lambda \sum_{i=1}^{P} \| I^{(P,i)} \|_* \quad (9)$$

In a preferred embodiment of the inventive method the image data is reconstructed by optimizing the target function under the condition that the correlation matrices have an optimally low rank. The target function Z according to equation (9) already takes into account the condition that the sought correlation matrices have an optimally low rank since the nuclear norm used in the target function Z is a measure of the rank of a matrix.

Additionally or alternatively, the image data can be reconstructed by optimizing the target function under the condition that the correlation matrix comprises a rank which matches the number of number of chemical substance types.

As an example, the rank of the optimized correlation matrix is likewise 2 in the case of two different chemical substance types.

In a particularly effective embodiment of the inventive method, the target function is iteratively optimized. The data consistency and the signal-to-noise ratio of the reconstructed image data is improved by each iteration step.

The inventive method is preferably used on a mixture of chemical substances, wherein the chemical substance types include fat and water.

The inventive method can be applied particularly effectively and quickly to a substance mixture in which the number of chemical substance types is exactly 2, as is the case, for example, if only the substance types fat and water are taken into account in imaging.

In a very practicable variant of the inventive method for the reconstruction of image data for at least two different chemical substance types, the raw data for the defined region has been ascertained at 4 or 6, preferably 8, different echo times at least. An increase in the number of echoes in an imaging MR method increases the amount of scan data acquired per time and therefore contributes to a shortening of the examination of the patient.

The inventive method for the reconstruction of image data for at least two different chemical substance types can be applied particularly exactly if the local region encompassed by the local correlation matrix is chosen such that the phase error in the local region is approximately constant. As already mentioned, the division of the local regions is based on the fact that the phase accumulation according to equation (3) is sufficiently constant in a delimited local region of a region to be examined since the phase accumulation can be ignored in the consideration of the local region in this case.

In a variant of the inventive method for ascertaining image data the local region comprises a region of 10*10*10, preferably 5*5*5 image points.

The inventive method for the reconstruction of image data for at least two different chemical substance types can be used particularly effectively if, subsequent to the reconstruction of an image data record, which comprises image data corrected of delays and artifacts but not yet separated according to substance type, a Dixon method or another method suitable for separation of the image data according to different chemical substances is then applied.

As mentioned, both the convergence and the robustness with respect to image artifacts are improved with a procedure of this kind. The duration of the inventive method is also shortened due to the improved convergence.

BRIEF DESCRIPTION OF THE DRAWINGS

FIG. 1 is a flowchart of an exemplary embodiment of an inventive method for the reconstruction of image data for at least two different chemical substance types.

FIG. 2 is a flowchart of an exemplary embodiment of an inventive method for ascertaining image data for at least two different chemical substance types.

DESCRIPTION OF THE PREFERRED EMBODIMENTS

Figure 3:
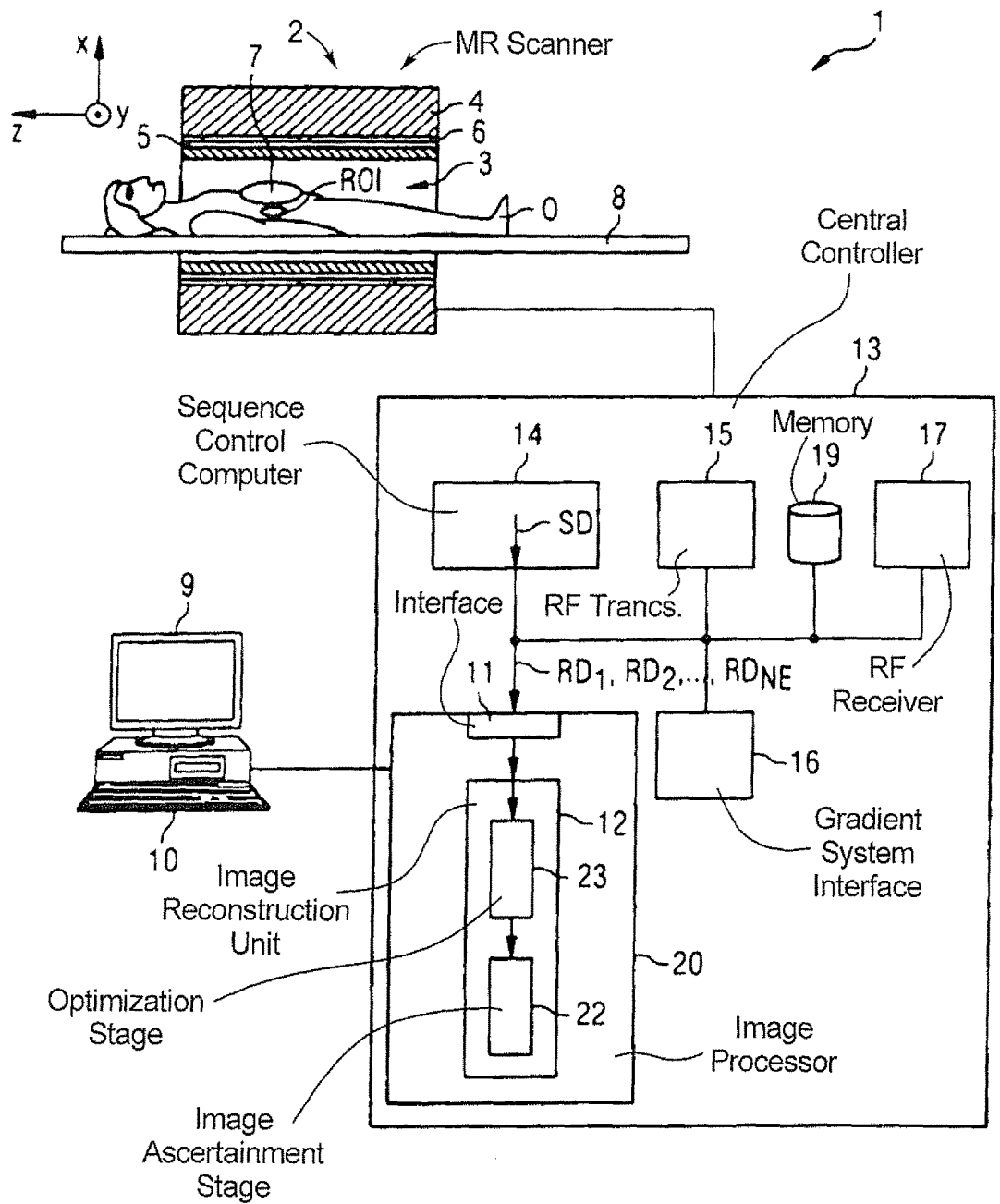
FIG. 3 schematically illustrates a magnetic resonance system according to an exemplary embodiment of the invention.

It will hereinafter be assumed, without limiting the generality of the invention, that the chemical substances are water and secondly fat.

FIG. 1 illustrates a method 100 for the reconstruction of image data W, F for at least two different chemical substance types in a defined region of an examination object O according to one exemplary embodiment of the invention. The reconstruction is based on raw data $RD_1$, $RD_2$, ..., $RD_{NE}$ which have been ascertained for the defined region at different echo times by means of a magnetic resonance scan. In step 1.I start values $I_0$ are fixed for a correlation matrix I that is to be determined. Optimization can begin at "0", in other words, all images are set to zero. Optimization can also be performed firstly without regularization (and this is quicker) and use the poor images from this optimization as the start values.

In step 1.II a target function Z, as is given for example by equation (9), is then optimized as a function of a correlation matrix I that is to be determined. The ascertained raw data $RD_1$, $RD_2$, ..., $RD_{NE}$ are incorporated in the calculation of the target function, as is illustrated by equation (9). Optimization of the target function Z can be achieved for example by a numerical iteration method to minimize a function. Such iteration methods are, for example, the augmented Lagrange multiplier method, the split Bregman method or the proximal gradient algorithm. In step 1.III the ascertained correlation matrix is subjected to a separation method to separate image data of different chemical species. As a result of step 1.III the image data separated according to different chemical species is obtained.

FIG. 2 illustrates a method 200 for ascertaining image data for at least two different chemical substance types in a defined region of an examination object by means of an imaging magnetic resonance scan according to one exemplary embodiment of the invention. As shown in FIG. 2, the method 200 begins at step 2.I with the acquisition of magnetic resonance echo raw data $RD_1$, $RD_2$, ..., $RD_{NE}$ of a defined region ROI at different echo times. The remaining steps 2.II to 2.IV correspond to the steps 1.I to 1.III, so reference is made at this point to the description of FIG. 1.

FIG. 3 illustrates roughly schematically an inventive magnetic resonance system 1 (hereinafter called "MR system" for short), with which the inventive methods can be carried out. The system 1 includes the actual magnetic resonance scanner 2 having an examination space 3 or a patient tunnel that extends in the z direction and into which, on a couch 8, a patient or test person O or another examination object, in whose body the region of interest ROI is located, for example a specific organ, can be moved.

The magnetic resonance scanner 2 is conventionally fitted with a basic field magnet system 4, a gradient system 6 and an RF transmitting antenna system 5 and RF receiving antenna system 7. In the illustrated exemplary embodiment the RF transmitting antenna system 5 is a body coil that is permanently fitted in the magnetic resonance scanner 2, whereas the RF receiving antenna system 7 comprises local coils that are to be arranged on the patient or test person (symbolized in FIG. 3 by only a single local coil). The body coil may also be used as an RF receiving antenna system and the local coils as an RF transmitting antenna system if these coils can each be switched into different operating modes.

The MR system 1 also has a central controller 13 which is used for controlling the MR system 1. This central controller 13 has a sequence control computer 14 for pulse sequence control. Using this, the sequence of radio-frequency pulses (RF pulses) and gradient pulses is controlled as a function of a chosen imaging sequence. An imaging sequence of this kind can be specified, for example, inside a scan protocol or control protocol which is stored, for example, in a memory 19 and can be chosen by an operator and optionally be modified. In the present case the sequence control computer 14 is designed such that any echo pulse sequence can be carried out for the acquisition of the raw data $RD_1, RD_2, \ldots RD_{NE}$ at different echo times.

For emitting the individual RF pulses, the central controller 13 has a radio-frequency transmitter 15 that generates the RF pulses, amplifies them and feeds them via a suitable interface (not shown in detail) into the RF transmitting antenna system 5. For controlling the gradient coils of the gradient system 6 the controller 13 has a gradient system interface 16. The sequence control unit 14 communicates appropriately, for example by emitting sequence control data SD, with the radio-frequency transmitter 15 and gradient system interface 16 to emit the echo pulse sequence. The controller 13 also has a radio-frequency receiver 17 (likewise communicating appropriately with the sequence control unit 14) to acquire magnetic resonance signals, i.e. the raw data $RD_1, RD_2, \ldots RD_{NE}$, received in a coordinated manner from the RF transmitting antenna system 7.

In the present case the central controller 13 has an inventive image processor 20 which may be implemented, for example, in the form of software on an arithmetic unit of the central controller 13, for example a microcontroller or the like. This image processor 20 takes over the acquired raw data $RD_1, RD^2, \ldots RD_{NE}$ via an interface 11. The acquired raw data $RD_1, RD_2, \ldots RD_{NE}$ is then transmitted to an image reconstruction unit 12. The image data reconstruction computer 12 has an optimization stage 23 and an image ascertainment stage 22. The image data reconstruction computer 12 is designed for the reconstruction of image data W, F of the defined region ROI on the basis of the acquired magnetic resonance echo raw data $RD_1, RD_2$. First a start value $I_0$ for a correlation matrix I that is to be optimized is fixed in the optimization stage 23, and this is then optimized with the aid of a target function Z, as is shown, for example, in equation (9). The optimized correlation matrix I is forwarded to the image ascertainment unit 22 which is designed to ascertain image data W, F, separated for the defined region ROI, for the different chemical substance types i.e. water and fat for example, on the basis of the optimized correlation matrix I which comprises the signal data $S(T_{E,e},x)$. Ascertaining the image data for more than two different substance types is also possible.

The central controller 13 can be operated via a terminal having an input unit (monitor) 10 and a display unit 9, by which the entire MR system 1 may also be operated by an operator. MR images, in particular the fat and water image data, may also be displayed separately on the display unit 9, and scans can be planned and started by the input unit 10, optionally in combination with the display unit 9.

The methods and components described in detail above are only exemplary embodiments and the basic principle may be varied within broad regions by those skilled in the art, without departing from the scope of the invention. The inventive MR system 1 and in particular the controller 13 can also have a large number of further components, not shown here in detail but conventionally present on such devices, such as a network interface to connect the entire system to a network and to be able to exchange raw data and/or image data, but also further data, such as for example patient-relevant data or control protocols, and to be able to store it on external memories for archiving and optionally subsequent output.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for reconstructing image data for at least two chemical substance types in a defined region of an examination object, comprising:
    providing a processor with raw magnetic resonance data acquired from a defined region in an examination object at different echo times in a magnetic resonance scan, said defined region comprising at least two different chemical substance types, and said raw magnetic resonance data comprising signal contributions from all of said chemical substance types;
    in said computer, executing a reconstruction algorithm to reconstruct image data from said raw magnetic resonance data, by first applying a target function to said raw magnetic resonance data that produces said image data with signal contributions from all of said chemical substance types, said target function comprising a regularization term that correlates the image data at the different echo times, and then separating the image data produced by said target function with said regularization term with respect to said at least two different chemical substance types, in order to produce a reconstructed image of the region in which at least one of said two different chemical substance types is represented; and
    making the reconstructed image available from the computer in electronic form.

2. A method as claimed in claim 1 comprising, in said reconstruction algorithm, formulating said regularization term based on a correlation matrix that takes into account sought image data values at different echo times and at different image points.

3. A method as claimed in claim 2 comprising applying said reconstruction algorithm to said raw data by optimizing the target function dependent on a condition selected from the group consisting of said correlation matrix having a low rank, and the correlation matrix has a rank that matches the number of said chemical substance types.

4. A method as claimed in claim 3 comprising optimizing said target function iteratively.

5. A method as claimed in claim 3 comprising selecting said local region to cause a phase error in said local region to be approximately constant.

6. A method as claimed in claim 5 wherein said local region is comprised of 10×10×10 image points.

7. A method as claimed in claim 5 wherein said local region comprises 5×5×5 image points.

8. A method as claimed in claim 1 comprising, in said reconstruction algorithm, formulating said regularization term based on a nuclear norm of a local correlation matrix that takes into account sought image data values at different echo times and at different image points of a local region.

9. A method as claimed in claim 1 comprising, in said reconstruction algorithm, formulating said regularization term based on a total of a plurality of nuclear norms respectively for a plurality of local correlation matrices, wherein each local correlation matrix takes into account sought image data values at different echo times and at different image points of a local region.

10. A method as claimed in claim 1 comprising acquiring said raw data from said defined region during at least four different echo times.

11. A method as claimed in claim 1 comprising applying a Dixon method to separate image data of said different chemical substances in said image reconstruction algorithm.

12. An image processor for reconstructing image data for at least two chemical substance types in a defined region of an examination object, comprising:

a computer having an input via which the computer receives raw magnetic resonance data acquired from a defined region in an examination object at different echo times in a magnetic resonance scan, said defined region comprising at least two different chemical substance types, and said raw magnetic resonance data comprising signal contributions from all of said chemical substance types;

said computer being configured to execute a reconstruction algorithm to reconstruct image data from said raw magnetic resonance data, by first applying a target function to said raw magnetic resonance data that produces said image data with signal contributions from all of said chemical substance types, said target function comprising a regularization term that correlates the image data at the different echo times, and then separating the image data produced by said target function with said regularization term with respect to said at least two different chemical substance types, in order to produce a reconstructed image of the region in which at least one of said two different chemical substance types is represented; and said computer being configured to make the reconstructed image available from the computer in electronic form.

13. A magnetic resonance (MR) apparatus comprising:

an MR scanner adapted to receive an examination object therein;

a computer configured to operate the MR scanner to acquire raw magnetic resonance data from a defined region in an examination object at different echo times in a magnetic resonance scan, said defined region comprising at least two different chemical substance types, and said raw magnetic resonance data comprising signal contributions from all of said chemical substance types;

said computer being configured to execute a reconstruction algorithm to reconstruct image data from said raw magnetic resonance data, by first applying a target function to said raw magnetic resonance data that produces said image data with signal contributions from all of said chemical substance types, said target function comprising a regularization term, that correlates the image data at the different echo times, and then separating the image data produced by said target function with said regularization term, with respect to said at least two different chemical substance types, in order to produce a reconstructed image of the region in which at least one of said two different chemical substance types is represented; and said computer being configured to make the reconstructed image available from the computer in electronic form.

14. A non-transitory, computer-readable data storage medium encoded with programming instructions, said storage medium being loaded into a processor of a magnetic resonance apparatus, and said programming instructions causing said processor to:

receive raw magnetic resonance data acquired from a defined region in an examination object at different echo times in a magnetic resonance scan, said defined region comprising at least two different chemical substance types, and said raw magnetic resonance data comprising signal contributions from all of said chemical substance types;

execute a reconstruction algorithm to reconstruct image data from said raw magnetic resonance data, by first applying a target function to said raw magnetic resonance data that produces said image data with signal contributions from all of said chemical substance types, said target function comprising a regularization term that correlates image data of the different echo times, and then separate the image data produced by said target function with said regularization term, with respect to said at least two different chemical substance types, in order to produce a reconstructed image of the region in which at least one of said two different chemical substance types are represented; and make the reconstructed image available from the computer in electronic form.

* * * * *